United States Patent [19]
Rowley et al.

[11] Patent Number: 6,124,778
[45] Date of Patent: *Sep. 26, 2000

[54] MAGNETIC COMPONENT ASSEMBLY

[75] Inventors: Anna K. Rowley, London; Robert G. Murton, Farnham; Donald E. Walker, Addleston, all of United Kingdom

[73] Assignees: Sun Microsystems, Inc., Mountain View, Calif.; Sun Microsystems Limited, United Kingdom

[ * ] Notice: This patent issued on a continued prosecution application filed under 37 CFR 1.53(d), and is subject to the twenty year patent term provisions of 35 U.S.C. 154(a)(2).

[21] Appl. No.: 08/950,530

[22] Filed: Oct. 14, 1997

[51] Int. Cl.[7] .............................. H01F 5/00; H01F 27/28; H05K 1/16
[52] U.S. Cl. .................... 336/200; 336/232; 336/212; 361/765
[58] Field of Search ................... 336/200, 232, 336/83, 212; 361/765, 782, 821

[56] References Cited

U.S. PATENT DOCUMENTS

| | | | |
|---|---|---|---|
| 4,429,349 | 1/1984 | Zachry | 361/686 |
| 4,635,179 | 1/1987 | Carsten | 363/70 |
| 4,854,040 | 8/1989 | Turek | 29/847 |
| 4,873,757 | 10/1989 | Williams | 29/602.1 |
| 4,899,271 | 2/1990 | Seiersen | 363/126 |
| 5,140,706 | 8/1992 | Maeda et al. | 336/65 |
| 5,321,380 | 6/1994 | Godek et al. | 336/232 |
| 5,353,001 | 10/1994 | Meinel et al. | 336/83 |
| 5,583,474 | 12/1996 | Mizoguchi et al. | 336/83 |
| 5,594,906 | 1/1997 | Holmes, II et al. | 395/750 |
| 5,598,327 | 1/1997 | Somerville et al. | 363/131 |
| 5,631,822 | 5/1997 | Silberkleit et al. | 363/144 |
| 5,726,615 | 3/1998 | Bloom | 336/83 |
| 5,760,671 | 6/1998 | Lahr et al. | 336/200 |
| 5,889,660 | 3/1999 | Taranowski et al. | 363/19 |

FOREIGN PATENT DOCUMENTS 0267 108   5/1988   European Pat. Off. .............. 336/200

*Primary Examiner*—Lincoln Donovan
*Assistant Examiner*—Anh Mai
*Attorney, Agent, or Firm*—Blakely Sokoloff Taylor & Zafman

[57] ABSTRACT

A magnetic component assembly includes a circuit board having at least one layer. A first winding is provided on at least one surface of a layer of the circuit board and a further winding is provided on the same or a different surface of the circuit board. A first magnetic core is associated with the first winding to define a first magnetic component and a further magnetic core is associated with the further winding to define a further magnetic component. There is thereby provided an assembly of two or more magnetic components integrated in a single circuit board providing an efficient space saving configuration. A particular application relates to the provision of integrated magnetic components for power supplies.

24 Claims, 9 Drawing Sheets

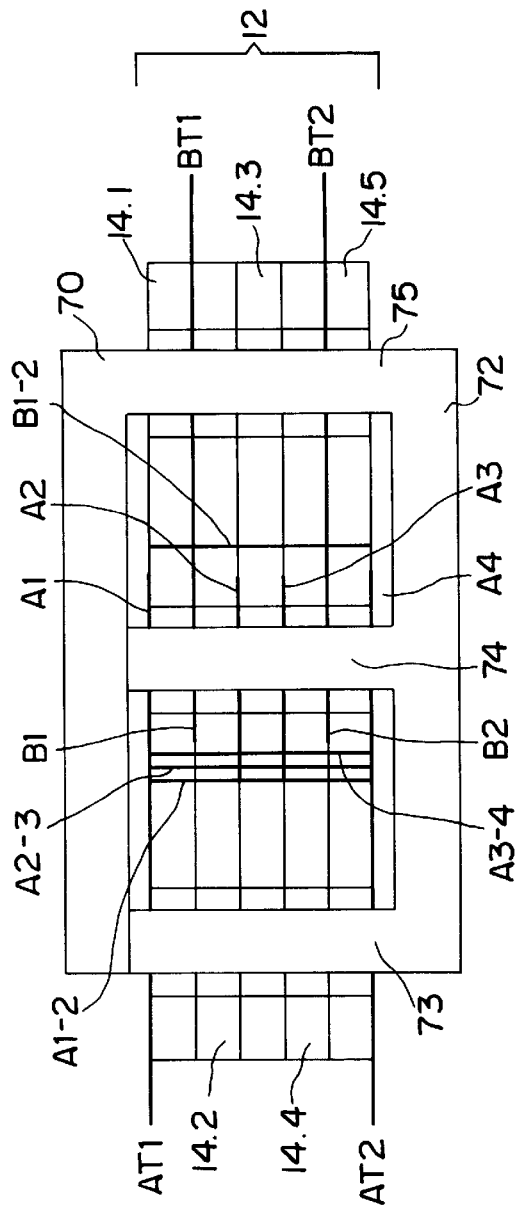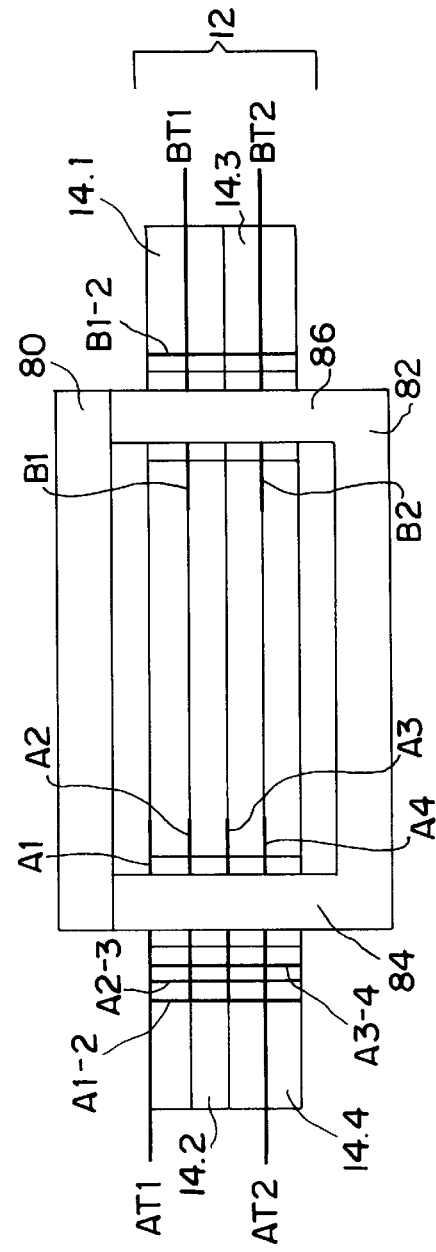

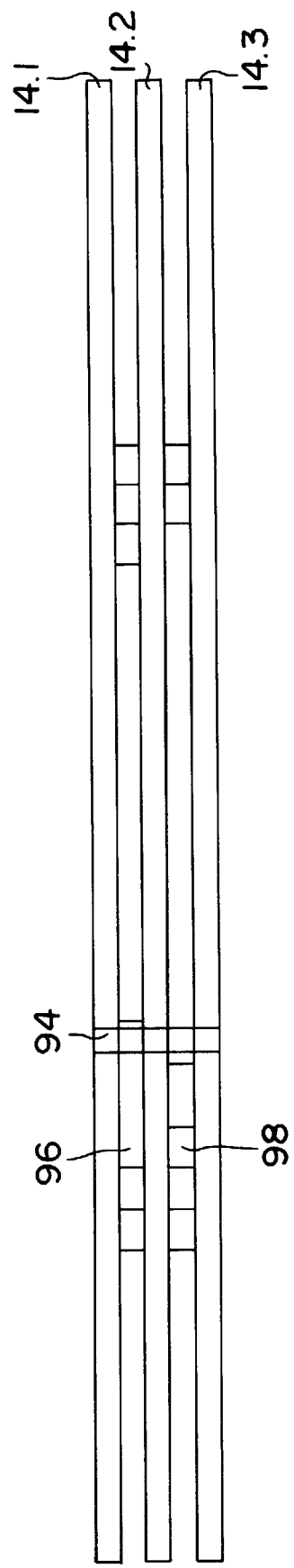

MAGNETIC COMPONENT ASSEMBLY

BACKGROUND AND INTRODUCTION

This invention relates to magnetic components for use, for example, in power supply units.

Magnetic components such as transformers and inductors are typically expensive and bulky components due to the physical and electrical requirements of such components. They find general application in many areas of circuit design. One application of such devices is in power supplies.

Different constructional techniques are known for manufacturing such magnetic components. One known type of magnetic component is called a planar magnetic component. Planar magnetic components have spiral windings formed on different layers of a multilayer circuit board and ferrite cores are provided to couple the windings. Examples of planar transformers are described in U.S. Pat. Nos. 5,353,001 and 5,598,327. These transformers form discrete components for mounting on a circuit board to form part of a conventional circuit. Accordingly, although the planar transformers can be made relatively compact, the overall circuit is still bulky and expensive due to the need to mount discrete magnetic components on a circuit board to form the circuit of which the planar transformer forms a part. There is a need further to reduce costs and improve space utilisation for power supply circuits and the like.

U.S. Pat. No. 5,583,474 describes examples of magnetic components (transformers or inductors) for an integrated circuit, the magnetic components comprising spiral windings formed between and insulated from first and second magnetic layers. Such a planar magnetic component can be integrated with active (e.g transistor) and passive (e.g. resistor or capacitor) elements within the integrated circuit. Such magnetic components for integration in an integrated circuit are suitable for low current applications. Accordingly, they are not suitable for higher power applications such as power supplies, for example. Moreover, there is no teaching of how to provide plural magnetic components for a conventional, non-integrated circuit, for example for a power supply.

A particular application of the invention relates to providing an efficient power supply unit with high power density, for example a 5 volts 70 amp power supply. It is proposed to provide a soft-switching phase shift control conversion topology, with the addition of current doubler synchronous rectification at its output stage. For such a topology, it is proposed to use four magnetic components, namely, a transformer, a commutating choke in series with the primary winding of the transformer, and two output filter inductors in series with the secondary winding of the transformer. However, using prior art techniques, the need for four magnetic components would result in a bulky and expensive power supply unit. Accordingly, there is a specific need to reduce the size and cost of such a power supply unit.

However, it should be noted that the aforedescribed power supply is but one application for the instant invention as there is, more generally, a need to enable to provision of multiple magnetic components in a more compact and cost efficient manner.

Thus, an aim of the present invention is to improve the provision of multiple magnetic components.

SUMMARY OF THE INVENTION

In accordance with a first aspect of the present invention, there is provided a magnetic component assembly comprising a circuit board having at least one layer. A first winding is provided on at least one layer of the circuit board and a further winding is provided on at least one layer of the circuit board, which can be on the same or a different surface or layer of the circuit board. A first magnetic core is associated with the first winding to define a first magnetic component and a further magnetic core is associated with the further winding to define a further magnetic component.

Accordingly, an embodiment of the invention provides an assembly of two or more magnetic components in a single circuit board. By integrating two or more magnetic components in a single circuit board assembly, the overall configuration of a circuit comprising multiple magnetic components can be made more efficient, providing savings in space required for the circuit and the cost thereof. The magnetic component assembly can be mounted on a main circuit board in the manner of a single magnetic component, although it in fact comprises multiple magnetic components. Thus, there can be a resulting reduction in the number of electrical connections to be made when assembling the circuits and the length of electrical connections between the magnetic components can be reduced. This in turn provides increases in reliability due to the reduction in the number of contacts to be made and reductions in parasitic capacitance effects.

The invention finds particular, but not exclusive, application to the provision of magnetic components for power supplies.

In a preferred embodiment the first magnetic component is a transformer. Where the transformer is an isolating transformer, a second winding can be associated with the first magnetic core, whereby the first winding forms a primary winding and the second winding forms a secondary winding of the transformer.

The further magnetic component can be a choke, for example a commutating choke connected in series with the primary winding of the transformer.

Alternatively, or in addition, a further magnetic component can be an output filter inductance connected in series with the secondary winding of the transformer, for example a second output filter inductance connected in series with the secondary winding of the transformer.

The transformer could be implemented with first and second windings arranged about a central limb of a magnetic core having two side limbs and a central limb. The side and central limbs of the magnetic core can each be arranged to extend through holes or bores in the circuit board.

Alternatively, the first and second windings could be arranged about respective side limbs of a magnetic core without a central core. In this case the side limbs of the magnetic core can be arranged to extend through holes or bores in the circuit board.

Preferably, at least one winding is formed as a spiral. The spiral winding is preferably formed in a planar manner on the surface of a layer of the printed circuit board, for example in the form of a printed circuit, or thick film circuit or the like. This provides a compact construction.

More preferably, the circuit board is a multilayer circuit board and at least one winding is formed from a plurality of spirals on respective layers of the circuit board, the spirals being interconnected through one or more intervening layers, for example by plated-through or metallised holes.

Preferably, the layer or layers of the circuit board are of insulating material and the windings are formed by conductive material. More preferably, the or each layer of the circuit board is formed by an insulating layer with the windings formed by printed conductive tracks (e.g. of metal). Where the circuit board is formed of a plurality of layers, these can be secured together by fusing the layers, by adhesives, fastening members or in any other suitable manner.

Preferably, conductive paths are also provided on the circuit board layers for interconnecting the windings and/or for connecting the windings to connectors for electrical connection to components external to the circuit board.

The assembly preferably comprises connectors for connection to a main board or backplane. The connectors can be edge connectors, for example for permitting the circuit board to be mounted perpendicularly with respect to the main board or backplane. Alternatively, the connectors can be arranged to permit parallel or coplanar mounting of the circuit board on a main board or backplane.

In accordance with another aspect of the invention, there is provided a magnetic component assembly comprising a multilayer circuit board; a transformer comprising primary and secondary windings formed on one or more of the layers and coupled by a magnetic core; and at least one inductive component comprising a further winding provided on one or more of the layers and a magnetic core associated therewith.

In accordance with a particular aspect of the invention, there is provided an integrated magnetic component assembly for a current doubling power supply, the assembly comprising: a multilayer circuit board; a transformer comprising primary and secondary windings formed on one or more of the layers and coupled by a magnetic core; a commutating choke connected in series with the primary winding of the transformer and formed from a further winding on one or more of the layers and a magnetic core associated therewith; and first and second output filter inductances connected in series with the secondary winding of the transformer and each formed from a respective further winding on one or more of the layers and a magnetic core associated therewith.

The invention further provides a power supply comprising an integrated magnetic component assembly, said assembly comprising: a multilayer circuit board; a transformer comprising primary and secondary windings provided on one or more of said layers and coupled by a magnetic core; a commutating choke connected in series with said primary winding of said transformer and formed from a further winding on one or more of said layers and a magnetic core associated therewith; and first and second output filter inductances connected in series with said secondary winding of said transformer and each formed from a respective further winding on one or more of said layers and a magnetic core associated therewith.

DESCRIPTION OF THE DRAWINGS

Particular illustrative embodiments of the invention will be described hereinafter with reference to the accompanying drawings in which:

FIG. 6 is a schematic cross-section of an example of a transformer for the assembly of FIG. 1 with a winding configuration as in FIG. 5;

FIG. 7 is a schematic cross-section of another example of a configuration for a transformer for the assembly of FIG. 1;

FIG. 10 is a schematic representation of the connection of tracks on different layers to form a winding for a magnetic component for the assembly of FIG. 1.

DESCRIPTION OF THE PREFERRED EMBODIMENT

Figure 1:
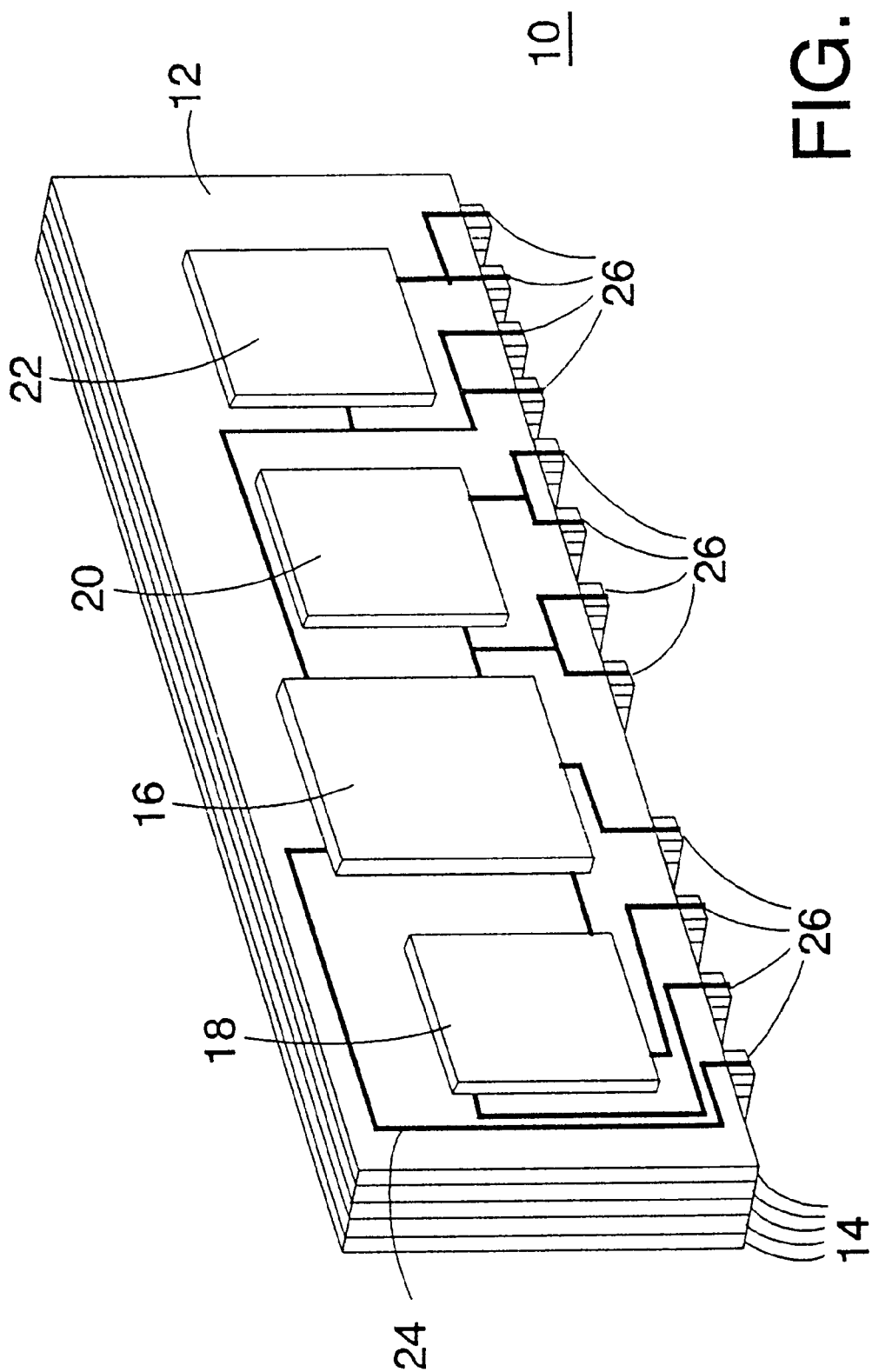
FIG. 1 is a schematic representation of an embodiment of a magnetic component assembly in accordance with the invention.

FIG. 1 shows an example of a magnetic component assembly 10 for a power supply unit. The assembly 10 comprises a multilayer printed circuit board 12 including a plurality of layers 14. Inductive windings are formed on individual layers 14 and, where appropriate, are interconnected via plated or metal filled bores extending between the layers. Magnetic (e.g. ferrite) cores are provided for the individual windings as appropriate to configure the individual magnetic components. In the particular example shown in FIG. 1, the assembly comprises four magnetic components for a power supply unit. The four magnetic components comprise a main isolating transformer (T1) 16, a commutating choke (Lc) 18 which is in series with the primary winding of the transformer 16, and two output filter inductors (L01) 20 and (L02) 22 in series with the secondary winding of the transformer 16. Electrical paths 24 are provided between the individual windings and magnetic components and also couple those components to connectors 26 for connection to external power supply unit components not provided in the assembly.

Figure 2:
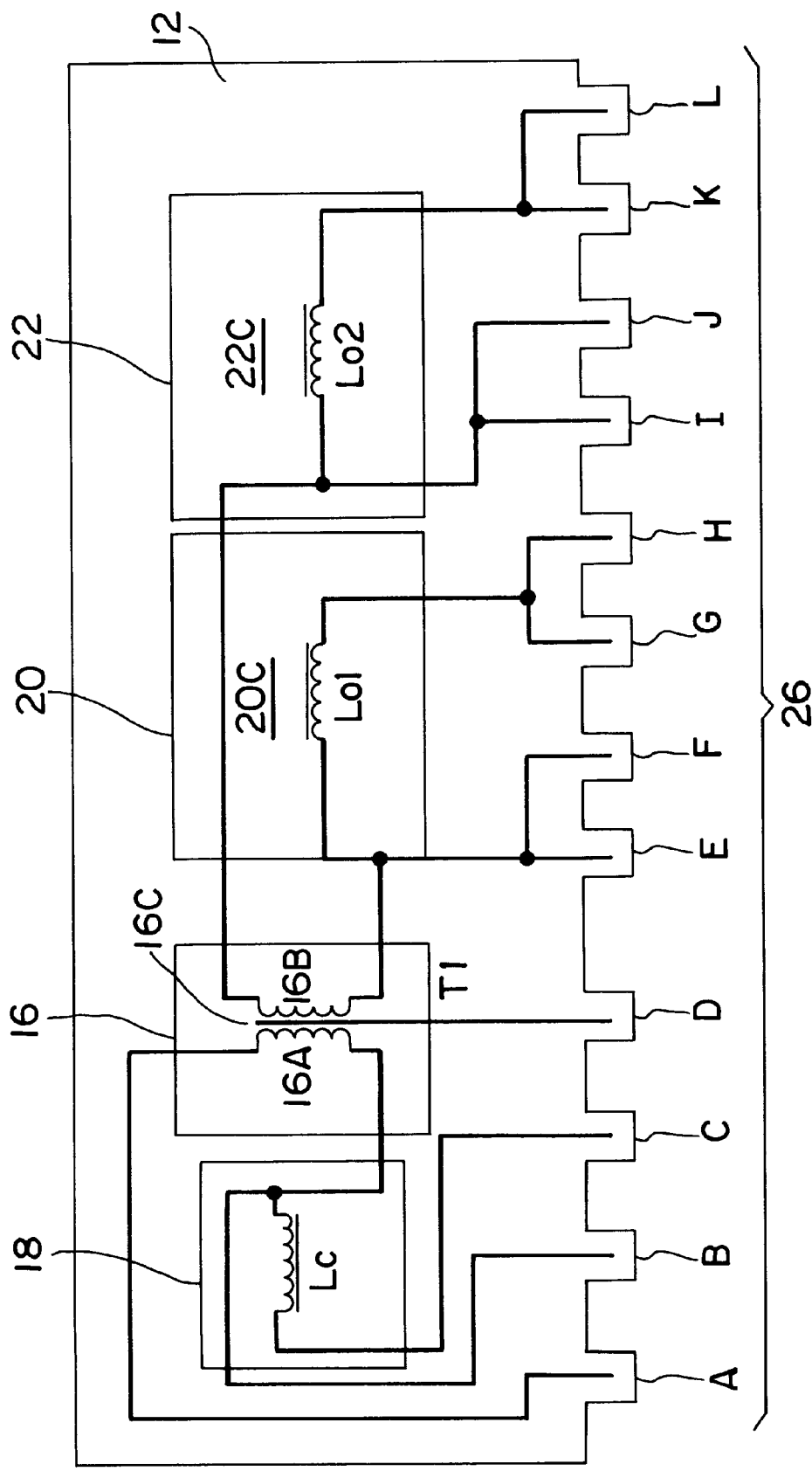
FIG. 2 is a further schematic representation of the assembly of FIG. 1.

FIG. 2 illustrates in more detail the individual magnetic components of the assembly of FIG. 1. It can be seen that external electrical connections B and C are connected to first and second terminals of the commutating choke (Lc) 18. One terminal of the commutating choke 18 is connected to one terminal of the primary winding 16A of the transformer (T1) 16. An external connector A is connected to a second terminal of the primary winding 16A of the transformer 16. One terminal of the secondary winding 16B of the transformer 16 is connected to one terminal of the first output filter inductor (L01) 20. The second terminal of the secondary winding 16B of the transformer 16 is connected to one terminal of the second output filter inductor (L02) 22. External connector D is connected to the core 16C of the transformer 16. External connectors E and F are connected to the first terminal of the first output filter inductor 20. External connectors G and H are connected to the second output terminal of the first output filter inductor 20. External connectors I and J are connected to the first terminal of the second output filter inductor 22. Output terminals K and L are connected to the second terminal of the second output filter inductor 22. In the particular embodiment described, the pairing of the external connectors E/F, G/H, I/J, K/L, is for current loading reasons. In an alternative embodiment single connectors could be provided subject to the current loading requirements.

Although in FIGS. 1 and 2 the electrical paths 24 are shown as being on an external surface of the printed circuit board 12, these could in fact be located between individual layers, as required.

Figure 3:
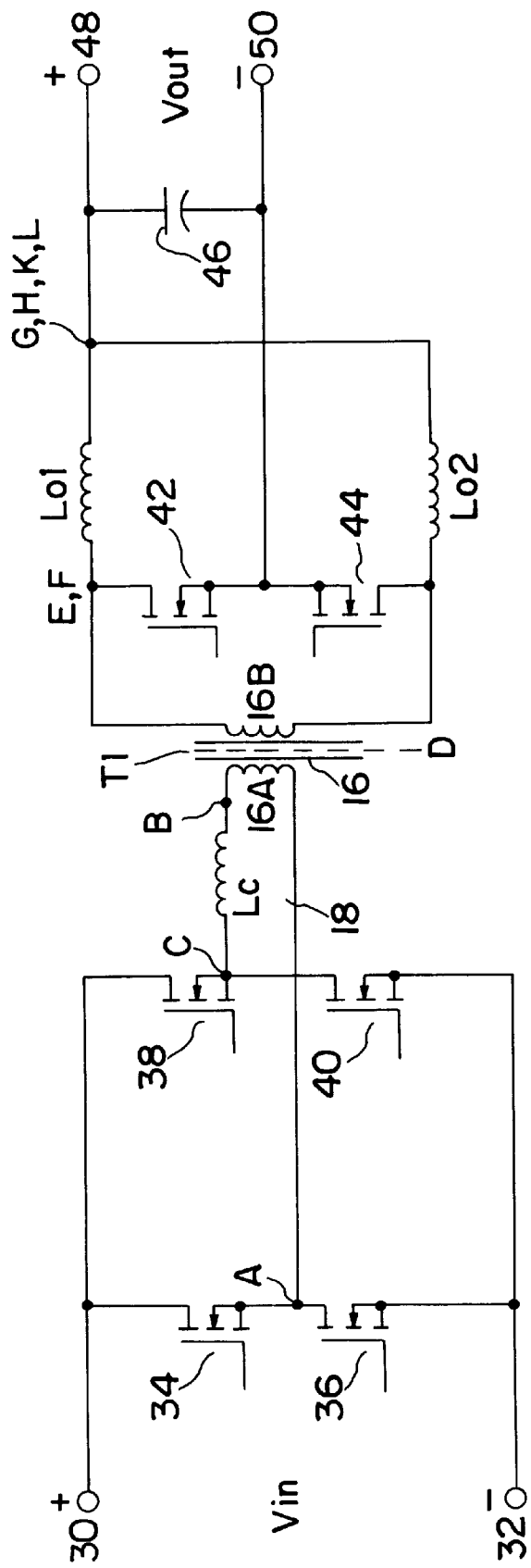
FIG. 3 is a schematic circuit diagram of a power supply circuit.

FIG. 3 is a circuit diagram of an example of a power supply circuit in which the magnetic component assembly of FIGS. 1 and 2 can be incorporated. This circuit is a phase-shifted full-bridge converter with current doubler synchronous rectifiers. FIG. 3 shows circuitry to the primary side of the transformer (T1) 16 and further circuitry to the secondary side of the transformer 16. The letters A–L represent the positions in the circuit at which the connections A–L shown in FIG. 2 are made to the circuit.

On the primary side of the transformer 16, an input voltage Vin is received across terminals 30 and 32. Transistors 34, 36, 38 and 40, which in the illustrated example are configured as metal oxide semiconductor field effect transistors (MOSFETs), form a full-bridge configuration on the primary side of the isolating transformer, 16. The MOSFETs 34, 36, 38 and 40 are controlled in accordance with a phase-shift pulse-width-modulation method. As a result of this control method, the dominant turn-on losses of the MOSFETs are substantially eliminated, while the soft-switching is maintained.

On the secondary side of the transformer 16, a current doubler approach with synchronous rectifiers is used to extend the soft-switching capability of the phase-shifted full-bridge converter under all load conditions. This approach to full-wave rectification requires two identical output inductors, (L01) 20 and (L02) 22. However, they are both working at half the operating frequency and half the rated current of the equivalent full-wave counterpart output inductor. The transformer construction becomes simpler by enabling the removal of the centre-tap that would otherwise be required for a conventional full-bridge secondary rectification. Also a better transformer window area and copper wiring utilisation is achieved. The circuit further comprises two MOSFETs 42 and 44 and a capacitor 46, with an output voltage Vout being provided across terminals 48 and 50.

There are four main switching stages in phase-shift control of this arrangement. During the first stage, the diagonal pair of MOSFETs 34 and 40 as well as MOSFET 42 are ON, while MOSFETs 36, 38 and 44 are OFF. During the second switching stage MOSFETs 34, 38, 42 and 44 are ON, while MOSFETs 36 and 40 are off. At the next switching stage, the diagonal pair of MOSFETs 36 and 38 as well as MOSFET 44 are ON, while MOSFETs 34, 40, and 42 are off. In the final switching stage, MOSFETs 36, 40, 42 and 44 are ON, while MOSFETs 34 and 38 are off. Soft-switching operation of the four MOSFETs on the primary side is achieved by introducing a delay time between the consecutive operating stages. During this delay time, a resonant action takes place between the various capacitances and inductances connected to the centre leg of the full-bridge circuit. The commutating choke (Lc) 18 is used as an integral part of the resonant inductor. However it may be adequate for the commutating choke to be replaced by the leakage inductance of the transformer 16.

Some of the main advantages of using the above techniques in a DC—DC converter design is achieving higher power densities, lower profile magnetics, higher efficiency and lower electromagnetic interference.

Figure 4:
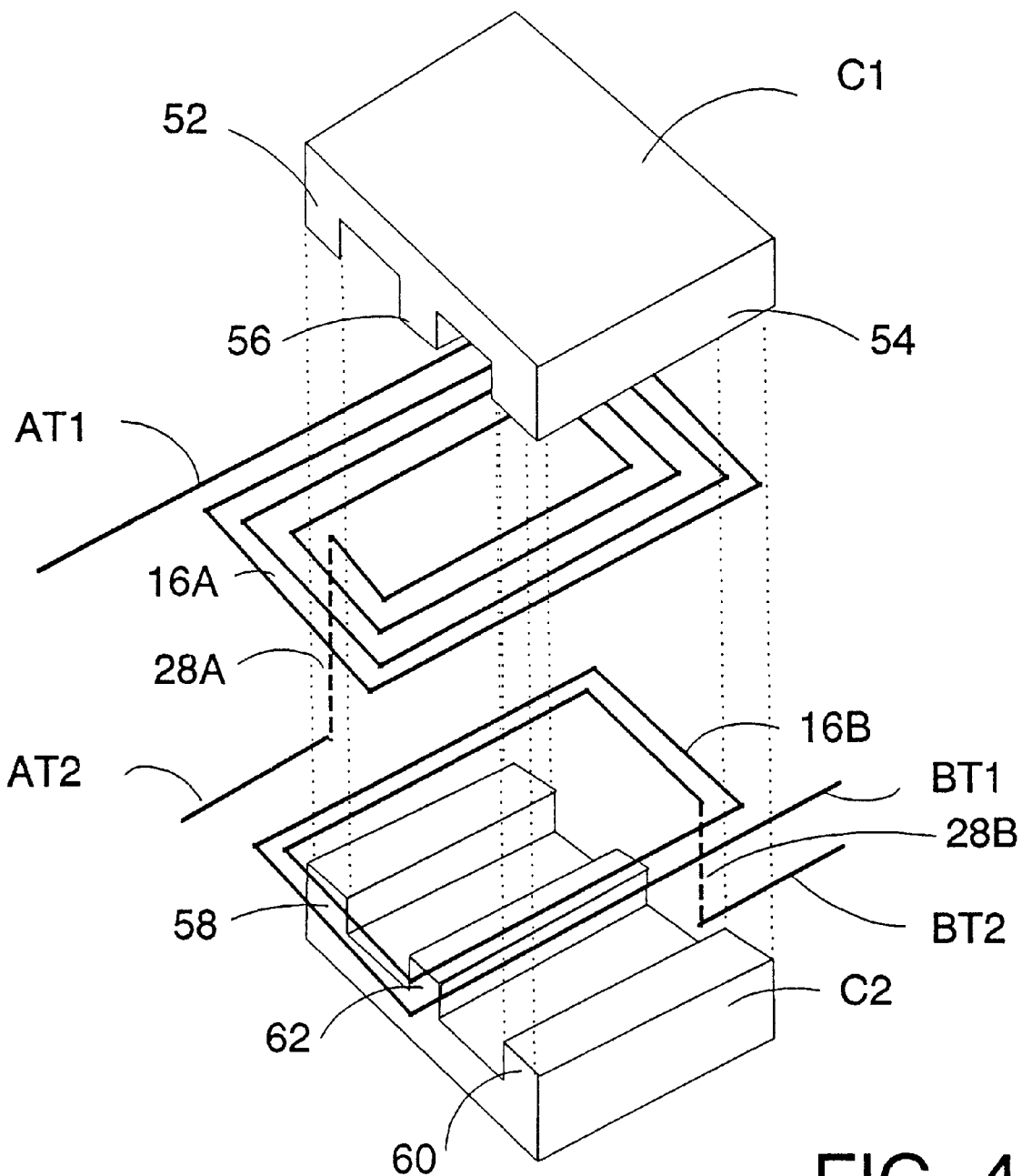
FIG. 4 is a schematic representation of an example of a configuration for a transformer for the assembly of FIG. 1.

FIG. 4 is a simplified schematic representation of one possible configuration for the transformer 16. FIG. 3 illustrates a 2:1 transformer with a primary winding 16A having four turns and a secondary winding 16B having two turns, each of which windings is located at a respective single layer within the multilayer printed circuit board (PCB). It will be noted that each of the windings 16A and 16B comprises a spiral track configuration. It will be appreciated that FIG. 3 is merely schematic, and in practice a larger, or smaller, number of turns in the spiral track could be provided. As shown in FIG. 4, a first terminal AT1 of the primary winding is in the same plane as the winding 16A. A second terminal AT2 is provided at a lower level than the winding 16A, that is on a different layer of the multilayer printed circuit board 12. The internal end of the spiral winding 16A is connected to the terminal AT2 via a through hole in the layers of the PCB, as represented by the dashed line 28A. A similar configuration exists for the secondary winding 16B with the first terminal BT1 in the plane of the secondary winding 16B and the second terminal BT2 connected to the inner end of the spiral winding 16B via a plated hole represented by the dashed line 28B.

Magnetic coupling between the primary and secondary windings 16A and 16B is provided by means of the magnetic core 16C (e.g. a ferrite core), which is formed of two separate partial cores C1;C2. Each of the partial cores C1;C2 has a generally E-shaped cross section with a planar portion, first and second side limbs 52,54; 58,60 and a central limb 56;62. The central limb 56;62 of each of the first and second partial cores C1;C2 are arranged to be located in and to meet within a through hole or bore provided in the multilayer circuit board inside the spiral windings 16A and 16B. The side limbs 52,54; 58,60 of the partial cores C1;C2 are arranged to be located in and to meet within respective through holes or bores provided in the multilayer printed circuit board outside the windings 16A and 16B. The three limbs of the partial cores C1 and C2 are thus arranged to be coupled to form a complete core 16C with magnetic circuits through each of the loops formed by the central limbs 56;62 and a respective pair of side limbs 52;58 or 54;60.

It will be appreciated that the configuration of the portions C1 and C2 of the core 16C are represented merely schematically. Many other configurations could be envisaged. For example, rather than an E:E configuration as in FIG. 4, one of the core portions could be provided simply as a planar portion of suitable magnetic material, with the other portion being provided with limbs which extend completely through the printed circuit board to meet with that planar portion, a so-called E:I configuration.

Figure 5:
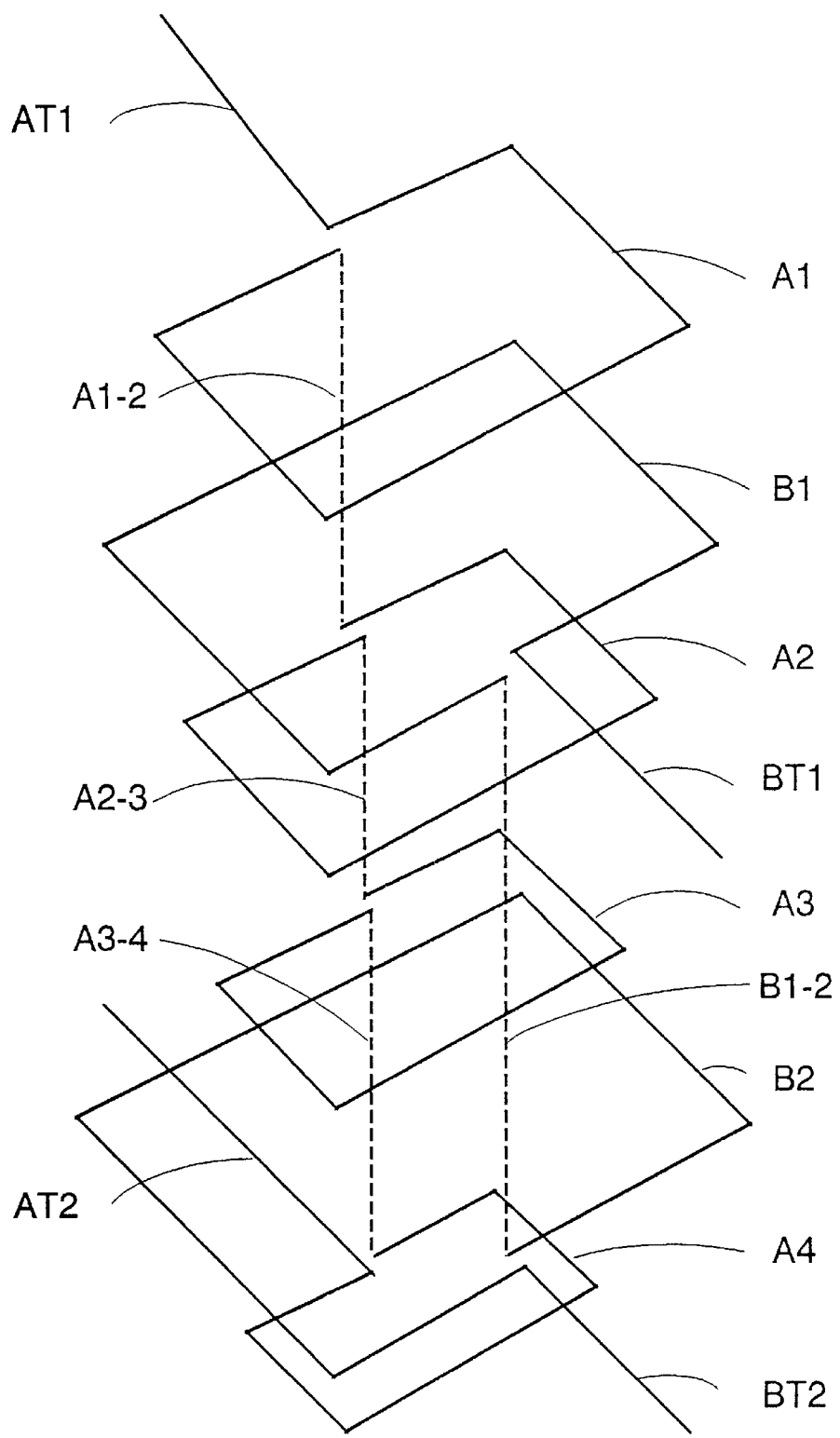
FIG. 5 is a schematic representation of an alternative example of a winding configuration for the transformer of FIG. 4.

As mentioned above, each of the primary and secondary windings of the embodiment of FIG. 4 are provided within a single layer. However, in other embodiments, one or more turns may each be provided at a separate layer. FIG. 5 is a schematic representation where the four turns of the primary winding A1, A2, A3 and A4 are each provided at a respective layer and the two turns of the secondary winding B1 and B2 are each provided at a respective further layer. Plated through holes (A1-2, A2-3, A3-4, B1-2) are provided to interconnect the various turns at the various layers. The plated through holes are each offset with respect to one another so that connection is made between two turns only to provide a series-connected winding. It will be noted that the turns B1;B2 of the secondary winding are interleaved between turns A1,A2; A3,A4 of the primary windings. The interleaving of the windings reduces leakage inductance.

FIG. 6 is a further representation of an example of a transformer with the winding configuration shown in FIG. 5. The core used in FIG. 6 is an E:I core with an E-shaped core portion 72 having two side limbs 73 and 75 and a central limb 74, which meets with a planar, or I-shaped core portion 70 to form the complete core 16C. As for FIG. 5, a spiral turn of the primary winding 16A is provided at each of four layers and a spiral turn of the secondary winding 16B is provided at each of two layers.

In the example shown in FIG. 6, this is achieved by means of a five layer multilayer circuit board 12, having layers 14.1, 14.2, 14.3, 14.4 and 14.5, with spiral tracks A1, A2, A3 and A4 for the primary winding 16A being provided on the upper surface of layers 14.1, 14.3, 14.4 and the lower surface of layer 14.5 and spiral tracks B1, B2 for the secondary winding 16B being provided on the upper surface of layers 14.2 and 14.5.

As described above, connections (preferably plated through holes) between the respective individual spiral tracks on the layers are provided in order to form the complete windings 16A and 16B extending between the terminals AT1, AT2 and BT1, BT2, respectively. Alternatives and equivalents to plated holes could alternatively be used, for example, pins which pass through the layers, to make contact between the tracks. In order to facilitate manufacture, the through connections between the individual windings should not overlap with each other and with any of the windings extending on one of the layers. In this manner, through plated bores A1-2, A2-3, A3-4, B1-2 can be provided which extend between the upper and lower surfaces (as shown in FIG. 6) of the multilayer printed circuit board. Thus the plated holes can be made after, rather than before, assembly of the multilayer printed circuit board. However, in particular embodiments, for example where a complex arrangement of windings or turns is required, at least some plated holes may only pass through selected layers and not from one external surface to the opposite external surface of the multilayer PCB.

FIG. 6 also represents the through holes provided through the multilayer printed circuit board 15 for receiving the limbs 73, 74 and 75 of the core 16C. It will be noted that the core in FIG. 6 comprises first and second inductive loops with both windings interleaved about the central limb 74.

The multi-layer circuit board can comprise any conventional insulating material, whether flexible or rigid, with the tracks and windings formed by printed circuit tracks, thick film circuits or the like, in a conventional manner using metal or other conductive material, and assembled to form a composite multilayer board. The choice of printed circuit tracks or thick film circuits can be made depending on the current to be conducted. The assembly of the layers can be achieved through the use of adhesives and/or heat treatment and/or pressure in a conventional manner. Whether the individual layers are flexible or rigid, the overall structure will typically be rigid due to its thickness and the multiplicity of layers.

FIG. 7 is a schematic representation of an alternative configuration for a transformer where a C-shaped core portion 80 meets up with a planar or I-shaped core portion 82 (a so-called C:I configuration). In the schematic example shown in FIG. 7, a 2:1 transformer is shown with a four layer printed circuit board 12. Spiral tracks having substantially the configuration of FIG. 6 are provided except that here the primary winding surrounds a limb 84 and the secondary winding surrounds a limb 86. The primary winding comprises turns A1, A2, A3 and A4 on the upper surface of layers 14.1, 14.2, 14.3 and 14.4, respectively. The secondary winding comprises turns B1 and B2 on the upper surface of layers 14.2 and 14.4, respectively. Through connections A1-2, A2-3, A3-4, B1-2 are provided between the spiral tracks on the individual layers in order to form the complete primary winding 16A between the first and second terminals AT1 and AT2, and the complete secondary winding 16B between the terminals BT1 and BT2.

Figure 8:
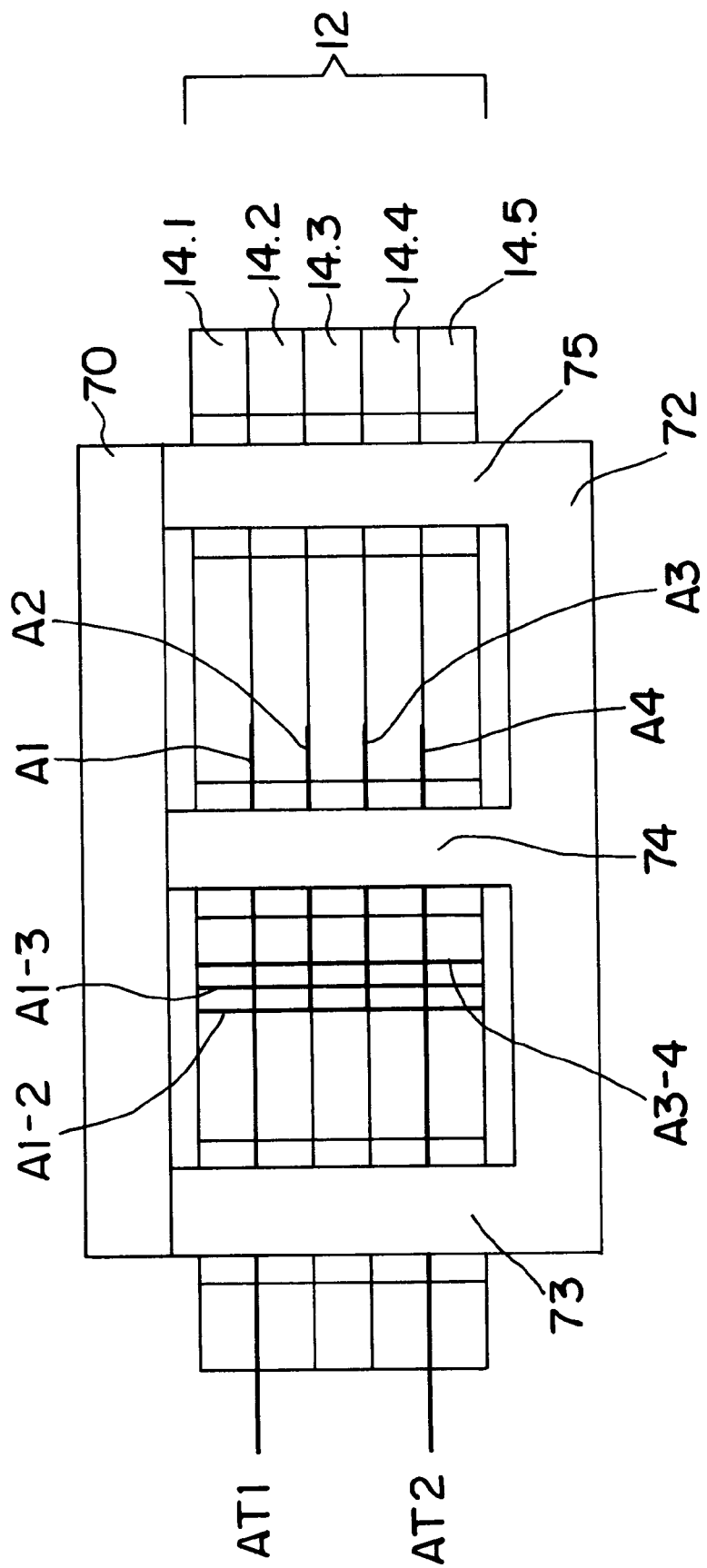
FIG. 8 is a schematic cross-section of an example of a configuration for an inductor for the assembly of FIG. 1.

FIG. 8 is a schematic representation of one possible configuration for an inductor. This corresponds substantially to the example of a transformer shown in FIG. 6, except that a single winding is provided, the single winding being mounted on the upper surfaces (as shown in FIG. 8) of layers 14.2, 14.3, 14.4 and 14.5. Due to the similarities, and the use of like reference numerals, this Figure need not be described separately and reference is made to FIG. 6 for a full description thereof.

Figure 9:
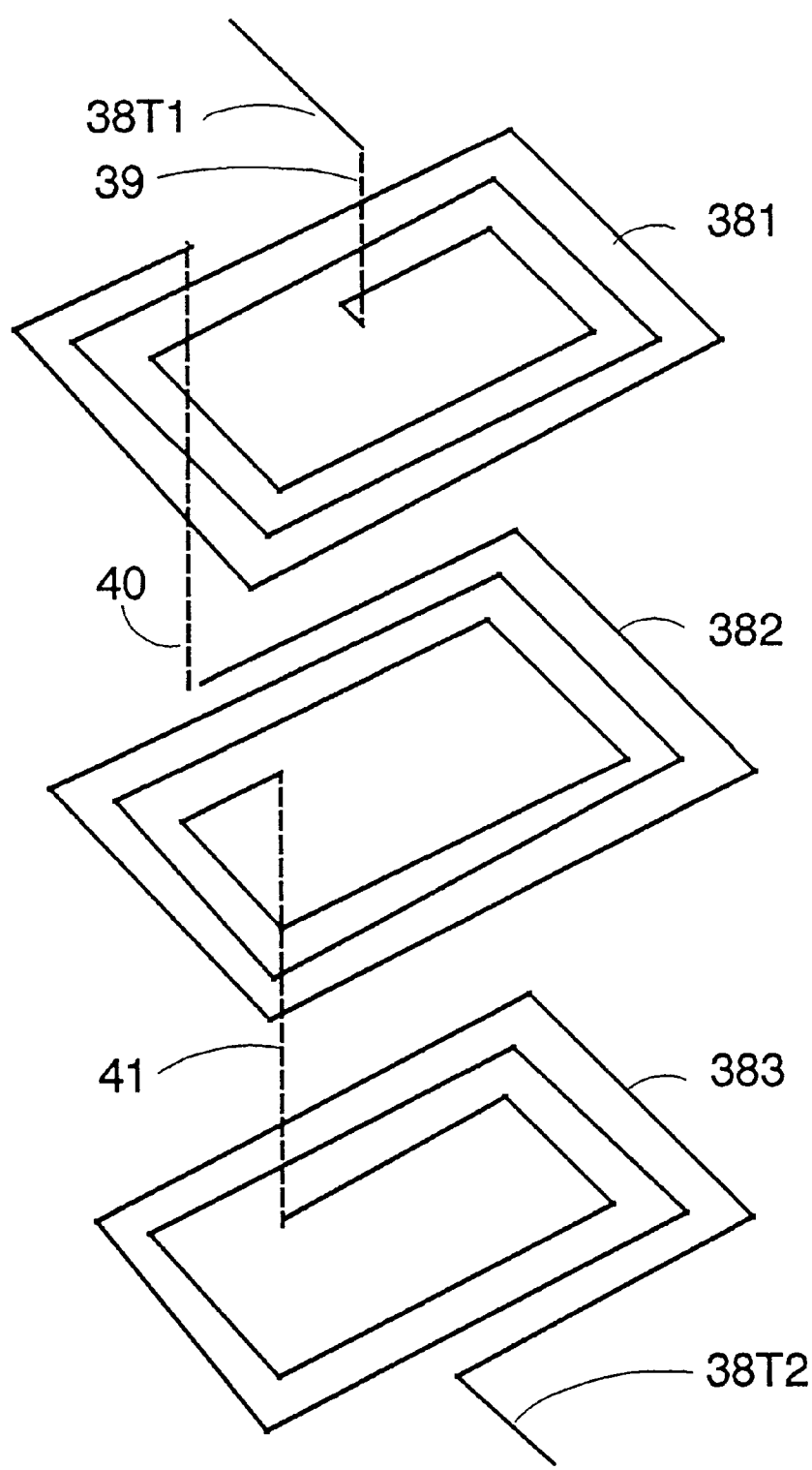
FIG. 9 is a schematic cross-section of an example of a winding configuration for a magnetic component of the assembly of FIG. 1.

FIG. 9 is a schematic representation of the connection of three separate spiral tracks (eg, comprising a plurality of turns) on three separate layers to form a single winding. It will be noted that four separate layers are required for the configuration shown in FIG. 9. A first terminal 38T1 is connected to the first spiral track 381 via an internal plated through hole 39. The external end of the spiral track 381 is connected to the spiral track 382 in the next lower layer by means of a plated through hole 40. The internal end of the spiral track 382 is connected to the third spiral winding 383 in the next lowest layer by a further plated hole 41. The external terminal 38T2 is formed in the same layer as the third spiral track 383. It will be noted in the configuration shown in FIG. 8 that by locating the connections between individual layers appropriately, it would be possible to provide through plated holes between both surfaces of the multilayer PCB to enable easy configuration and manufacture of the multilayer PCB. It will be noted that a winding in FIG. 9 is made up of a plurality of spiral windings, each comprising a plurality of turns. An arrangement as shown in FIG. 9 could be used, for example, for any of the windings described above.

It will be appreciated that suitable spacing of the individual loops of the spiral tracks (for example by providing a wide space between adjacent loops on one layer and not on another layer) could be used to enable more than the three layers shown in FIG. 9 be achieved.

FIG. 10 is a schematic representation of the interconnection of windings located on two separate layers. In the schematic representation in FIG. 10, a first winding is provided on an upper surface of layer 14.1 and a second winding is provided on an upper surface of layer 14.2. A plated through hole 34 provides a connection between the first spiral winding 36 and the second spiral winding 38. It is assumed that both of the windings extend in a clockwise direction so that the magnetic effect of both windings is in the same direction.

In the above examples, a 4:2 transformer (i.e. a 2:1 transformer) has been shown. However, it will be understood that in other embodiments other transformer ratios could be provided. Moreover, an integer relationship between the voltages, and hence the number of windings, need not be provided. For example, for a conversion between 24 volts and 5 volts, a 24:5 ratio of turns could be provided between the primary and secondary windings.

The output voltage Vout=Ts/Tp, Vin, where Ts is the number of secondary turns, Tp is the number of primary turns and Vin is the input voltage.

It will be appreciated that the arrangement shown in the Figures enables all of the magnetic components for a power supply, for example for a soft-switching phase-shift-control conversion topology power supply with current-doubler synchronous rectification, to be implemented on a single multilayer PCB. In the preferred embodiment, a vertical mounting of the PCB into the power supply motherboard is preferred. Accordingly, it would be possible to assemble all the main power magnetic components as a single sub-assembly vertically (that is perpendicularly to) the main printed circuit board of the power supply, with the sub-assembly having a very low profile. For example, a magnetic sub-assembly for a 5 volt 70 amp power supply could be constructed with the maximum thickness as low as 15 mm.

Alternatively, a horizontal arrangement (that is coplanar with the main power supply printed circuit board) becomes possible, by cutting holes through the main printed circuit board for the cores of a sub-assembly as shown in FIG. 1. This would allow for a very low profile unit. Such a configuration might also provide advantageous heat management characteristics in certain applications.

Also, rather than providing edge connectors 20 as shown in FIG. 2, pins could be provided which extend from the sub-assembly, which would facilitate mounting in a coplanar manner with the main printed circuit board of the power supply.

By having a single board assembly for the magnetic components, and hence eliminating the use of magnetic copper wires or foils, external connections in and between the magnetic component wiring terminations are also eliminated. The interconnections can be formed (as described) within the same printed circuit board as the windings.

Using a typical phase-shift-full-bridge conversion configuration with current-doubler synchronous rectification, and a conventional magnetic planar assembly, there would be a requirement for many wiring termination connections. With a construction as described above, the number of connections can be significantly reduced (eg, by half), and consequently the magnetic sub-assembly footprint can be considerably reduced. Also, by shortening interwinding connection lengths, parasitic component effects can also be reduced. Good heat management could also be achieved by the correct choice of cores, the correct choice of parallel copper layers and optimal winding arrangements for a particular configuration. An integrated assembly of planar magnetic components as described can result in lower overall costs than would be the case with discrete magnetic components.

Although particular examples of the invention have been described, it will be appreciated that the invention is not limited thereto. For example, although a particular application has been described, the invention is applicable to other applications requiring multiple magnetic components. Also, although only selected winding configurations and circuit configurations are shown, these can be adapted to suit the particular application and performance requirements. Indeed, the invention finds general application to the integrating of individual magnetic components in a single printed circuit board assembly.

Although particular embodiments of the invention have been described, it will be appreciated that the invention is not limited thereto, and many modifications and/or additions may be made within the spirit and scope of the invention as defined in the appended Claims. For example, different combinations of the features of the dependent Claims may be combined with the features of any of the independent Claims.

What is claimed is:

1. A magnetic component assembly comprising:
   a circuit board having at least one layer;
   a first winding provided on at least one layer of said circuit board;
   a further winding provided on at least one layer of said circuit board;
   a first magnetic core associated with said first winding to define a first magnetic power supply component;
   a further magnetic core associated with said further winding to define a further magnetic power supply component ;
   a plurality of connectors formed in said circuit board for mounting said circuit board on one of a main circuit board and a backplane, and for electrically connecting to power supply components on the main circuit board or the backplane; and
   a plurality of conductive paths in said circuit board connecting said first and further magnetic components to said plurality of connectors.

2. An assembly according to claim 1, wherein said first magnetic component is a transformer.

3. An assembly according to claim 2, wherein a second winding is associated with said first magnetic core and said transformer is an isolating transformer, whereby said first winding forms a primary winding and said second winding forms a secondary winding of said transformer.

4. An assembly according to claim 3, wherein said further magnetic component is an output filter inductance connected in series with said secondary winding of said transformer.

5. An assembly according to claim 4, comprising a second output filter inductance connected in series with said secondary winding of said transformer.

6. An assembly according to claim 3, wherein said further magnetic component is a commutating choke connected in series with said primary winding of said transformer.

7. An assembly according to claim 6, further comprising at least one output filter in series with said secondary winding of said transformer.

8. An assembly according to claim 3, wherein said first and second windings are arranged about a central limb of a magnetic core having a central and two side limbs.

9. An assembly according to claim 3, wherein said first and second windings are arranged about respective limbs of a magnetic core having two side limbs.

10. An assembly according to claim 1, wherein said further magnetic component is a choke.

11. An assembly according to claim 1, wherein at least one winding is provided as a spiral winding.

12. An assembly according to claim 11, wherein said circuit board is a multilayer circuit board and at least one winding is provided from a plurality of spiral tracks on respective layers of said circuit board, said spiral tracks being interconnected through one or more intervening layers.

13. An assembly according to claim 1, wherein said circuit board is a multilayer circuit board and at least one winding is formed from respective tracks on a plurality of layers of said circuit board, respective tracks being connected through an intervening layer.

14. An assembly according to claim 1, wherein said layer or layers of said circuit board are of insulating material and said windings are formed of conductive material.

15. An assembly according to claim 14, wherein said conductive material forms printed tracks on said insulating material of said layer or layers.

16. An assembly according to claim 1 wherein the connectors are edge connectors permitting the circuit board to be mounted perpendicularly to the main board.

17. A magnetic component assembly comprising:
   a multilayer circuit board having a plurality of layers;
   a power supply transformer comprising primary and secondary winding provided on one or more of said layers and coupled by a magnetic core; and
   at least one inductive power supply component comprising a further winding provided on one or more of said layers and a magnetic core associated therewith;

first electrical paths located at said circuit board for electrically connecting said transformer to said at least one inductive components;

a plurality of connectors formed in said circuit board for mounting said circuit board on one of a main circuit board and a backplane, and for electrically connecting to power supply components on the main circuit board or the backplane; and a plurality of conductive paths in said circuit board connecting at least one of said primary secondary and further windings to said plurality of connectors.

18. An assembly according to claim 17, wherein said at least one inductive component is a commutating choke connected in series with said primary winding of said transformer.

19. An assembly according to claim 18, wherein said at least one inductive component is an output filter inductance connected in series with said secondary winding of said transformer.

20. An assembly according to claim 19, wherein said circuit board is a multilayer circuit board and at least one winding is formed from a plurality of spiral windings on respective layers of said circuit board, said spiral windings being interconnected through one or more intervening layers.

21. An integrated magnetic component assembly for a current doubling power supply, said assembly comprising:

a multilayer circuit board;

a transformer comprising primary and secondary windings provided on one or more of said layers and coupled by a magnetic core;

a commutating choke connected in series with said primary winding of said transformer and formed from a further winding on one or more of said layers and a magnetic core associated therewith; and first and second output filter inductances connected in series with said secondary winding of said transformer and each formed from a respective further winding on one or more of said layers and a magnetic core associated therewith.

22. An assembly according to claim 21, wherein at least one winding is formed from a plurality of spiral windings on respective layers of said circuit board, said spiral windings being interconnected through one or more intervening layers.

23. An assembly according to claim 21, comprising a plurality of edge connectors for connecting said magnetic component assembly to further components of said power supply, electrical paths being formed between said magnetic components and said connectors.

24. A power supply comprising an integrated magnetic component assembly, said assembly comprising:

a multilayer circuit board;

a transformer comprising primary and secondary windings provided on one or more of said layers and coupled by a magnetic core;

a commutating choke connected in series with said primary winding of said transformer and formed from a further winding on one or more of said layers and a magnetic core associated therewith; and first and second output filter inductances connected in series with said secondary winding of said transformer and each formed from a respective further winding on one or more of said layers and a magnetic core associated therewith.

* * * * *